United States Patent
Coots et al.

(10) Patent No.: US 11,156,993 B2
(45) Date of Patent: Oct. 26, 2021

(54) SEMICONDUCTOR DIE OFFSET COMPENSATION VARIATION

(71) Applicant: Universal Instruments Corporation, Conklin, NY (US)

(72) Inventors: Charles Andrew Coots, Binghamton, NY (US); John Joseph Pichura, Kirkwood, NY (US); Maxim Factourovich, Binghamton, NY (US)

(73) Assignee: UNIVERSAL INSTRUMENTS CORPORATION, Conklin, NY (US)

( * ) Notice: Subject to any disclaimer, the term of this patent is extended or adjusted under 35 U.S.C. 154(b) by 344 days.

(21) Appl. No.: 16/304,739

(22) PCT Filed: Jun. 2, 2017

(86) PCT No.: PCT/US2017/035714
§ 371 (c)(1),
(2) Date: Nov. 27, 2018

(87) PCT Pub. No.: WO2017/210576
PCT Pub. Date: Dec. 7, 2017

(65) Prior Publication Data
US 2020/0301404 A1    Sep. 24, 2020

Related U.S. Application Data

(60) Provisional application No. 62/344,820, filed on Jun. 2, 2016.

(51) Int. Cl.
*G05B 19/418* (2006.01)
*H01L 21/67* (2006.01)
*G06F 13/10* (2006.01)

(52) U.S. Cl.
CPC .. *G05B 19/41885* (2013.01); *H01L 21/67144* (2013.01); *G05B 2219/45031* (2013.01); *G06F 13/10* (2013.01)

(58) Field of Classification Search
CPC ......... H01L 21/68; H01L 21/66; H01L 21/67; H01L 22/10; H01L 22/20; H01L 22/12;
(Continued)

(56) References Cited

U.S. PATENT DOCUMENTS 6,374,149 B1 * 4/2002 Subramanian ........ H01L 21/681
414/936
8,798,966 B1 * 8/2014 Hench .................. G06F 13/105
703/2

(Continued)

FOREIGN PATENT DOCUMENTS

| EP | 1630862 A1 | 3/2006 |
| JP | 2000243763 A | 9/2000 |
| WO | 2017/210576 A1 | 12/2017 |

OTHER PUBLICATIONS

Application No. PCT/US2017/035714, International Search Report and the Written Opinion of the International Searching Authority, or the Declaration dated Aug. 11, 2017, 7 pages.

(Continued)

*Primary Examiner* — Ronald D Hartman, Jr.
(74) *Attorney, Agent, or Firm* — Schmeiser, Olsen & Watts, LLP

(57) ABSTRACT

A method and system for improving an automated pick and place apparatus semiconductor device placement process is provided. The method includes automatically executing a shift measurement associated with an offset from an original placement of a plurality of semiconductor die of a semiconductor wafer for processing. An associated shift measurement value is retrieved and stored in a database that includes previously retrieved shift measurement values of previously measured shift measurements. Specified models are executed with respect to all shift measurement values and a predicted shift measurement value associated with a future offset for a new plurality of semiconductor die on a new (Continued)

semiconductor wafer for processing is determined. Placement hardware of the pick and place apparatus is placed in multiple positions for generating the new plurality of semiconductor die on the new semiconductor wafer in accordance with the predicted shift measurement value.

20 Claims, 14 Drawing Sheets

(58) Field of Classification Search
CPC ... H01L 22/30; H01L 21/67144; G06F 13/10; G06F 17/30; G06F 17/50; G06F 17/10; G05B 19/41885; G05B 2219/45031
See application file for complete search history.

(56) References Cited

U.S. PATENT DOCUMENTS

| | | | | |
|---|---|---|---|---|
| 2003/0227624 | A1* | 12/2003 | Wu | G03F 7/7075 356/400 |
| 2004/0258514 | A1* | 12/2004 | Raaijmakers | H01L 21/681 414/416.08 |
| 2005/0140977 | A1* | 6/2005 | Yuen | H01L 21/681 356/400 |
| 2008/0074678 | A1 | 3/2008 | Willis et al. | |
| 2008/0188016 | A1* | 8/2008 | Pare | G06T 7/0004 438/16 |
| 2009/0009741 | A1* | 1/2009 | Okita | G03F 7/7085 355/53 |
| 2009/0279989 | A1* | 11/2009 | Wong | H01L 21/68 414/217 |
| 2011/0147897 | A1* | 6/2011 | Varela | G03F 7/70433 257/620 |
| 2016/0011122 | A1* | 1/2016 | Pacheco | G01N 21/21 356/369 |

OTHER PUBLICATIONS

Office Action and Search Report (dated Nov. 27, 2019) for Swedish Patent Application No. 1851419-0—Filing date: Jun. 2, 2017—3 pages.
Office Action and Search Report—Notice (4 months) (dated Nov. 27, 2019) for Swedish Patent Application No. 1851419-0—Filing Date: Jun. 2, 2017—6 pages.
Yeon et al., "Compensation Method for Die Shift Caused by Flow Drag Force in Wafer-Level Molding Process," Micromachines, vol. 7, 95 (May 2016); DOI: 10.3390/mi7060095; abstract; sections 3-5. 12 pages.
Sharma, et al., "Solutions Strategies for Die Shift Problem in Wafer Level Compression Molding," IEEE Transactions on Components, Packaging and Manufacturing Technology, vol. 1, 502 (2011); DOI: 10.1109/TCPMT.2010.2100431; abstract; figures 7-9; sections III-IV. 8 pages.
Office Action in corresponding Swedish Patent Application No. 1851419-0 dated Feb. 10, 2021. 5 pages.
Written Opinioin in related Singagorean Patent Application No. 11201810017V dated May 28, 2021. 6 pages.
Notice of Reasons for Refusal in related Japanese Patent Application No. 2018-560992 dated Jun. 8, 2021. 7 pages.

* cited by examiner

SEMICONDUCTOR DIE OFFSET COMPENSATION VARIATION

RELATED MATTERS

This application claims priority to PCT Application No. PCT/US2017/035714, having a filing date of Jun. 2, 2017, which claims priority to provisional patent application No. 62/344,820 filed Jun. 2, 2016, and entitled "Die Offset Variation Compensation," the disclosures of which are hereby incorporated by reference.

FIELD

The present disclosure relates generally to integrated circuits and more specifically to systems, methods and tools for mathematically modeling, predicting, and adjusting placement of dies of semiconductor material of an integrated circuit to compensate for stochastically driven shifts in die placement.

BACKGROUND

Modern industrial processes for mass-producing integrated circuit packages often involve arranging semiconductor die in a wafer-like pattern and then using a liquefied form of a molding resin to simultaneously create thousands of packages for subsequent use in the later stages of electronic assembly. These integrated circuit production processes may rely on die placement requirements that are highly accurate. However, such a level of accuracy may not be achievable using currently available technology. By definition, the current processes are prone to stochastically driven shifts in the die placements that may lead to die misalignment and as result, increased defect rates in the integrated circuit products.

Currently available compensation methods are limited. The methods are either limited to calculating a mean offset of the die from a dies' nominal locations or use linear regression models in order to attempt to correct the variations in the displacement in different wafer areas. In some cases the adjustments to the die or wafer are done manually, by inserting desired values into a product adjustments list.

Some of the limitations of the previous techniques may include a lack of local adjustment that does not suppress local variations due to particularities of the substrate shape, mold deposition, variations in adhesive thickness, die shape and size, as well as many other causes. Limitations of the previous models and techniques may be prone to fail near the edges of the wafer where a backflow effect may take place and due to the variations among different placing modules (i.e. hands and/or spindles), current methods and systems of adjustment may require multiple models to be generated and superimposed, which introduced additional errors.

As such, an improved system, method and tools to compensate for die offset variations would be well received in the art.

SUMMARY

A first aspect of the invention provides an automated semiconductor device placement improvement method comprising: automatically executing, by a processor of a pick and place apparatus, a shift measurement associated with an offset from an original placement of a plurality of semiconductor die of a semiconductor wafer for processing; retrieving, by the processor, a shift measurement value associated with the shift measurement; storing, by the processor in a database, the shift measurement value, wherein the database comprises a plurality of previously retrieved shift measurement values associated with previously measured shift measurements for offsets from an original placement for a previous plurality of semiconductor die of a previous plurality of semiconductor wafers for processing; executing, by the processor, specified models with respect to the shift measurement value and the plurality of previously retrieved shift measurement values; determining, by the processor based on results of the executing, a predicted shift measurement value associated with a future offset for a new plurality of semiconductor die on a new semiconductor wafer for processing; and automatically placing, by the processor, placement hardware of the pick and place apparatus in multiple positions for generating the new plurality of semiconductor die on the new semiconductor wafer is accordance with the predicted shift measurement value.

A second aspect of the invention provides a computer program product, comprising a computer readable hardware storage device storing a computer readable program code, the computer readable program code comprising an algorithm that when executed by a processor of a pick and place apparatus implements an automated semiconductor device placement improvement method, the method comprising: automatically executing, by the processor, a shift measurement associated with an offset from an original placement of a plurality of semiconductor die of a semiconductor wafer for processing; retrieving, by the processor, a shift measurement value associated with the shift measurement; storing, by the processor in a database, the shift measurement value, wherein the database comprises a plurality of previously retrieved shift measurement values associated with previously measured shift measurements for offsets from an original placement for a previous plurality of semiconductor die of a previous plurality of semiconductor wafers for processing; executing, by the processor, specified models with respect to the shift measurement value and the plurality of previously retrieved shift measurement values; determining, by the processor based on results of the executing, a predicted shift measurement value associated with a future offset for a new plurality of semiconductor die on a new semiconductor wafer for processing; and automatically placing, by the processor, placement hardware of the pick and place apparatus in multiple positions for generating the new plurality of semiconductor die on the new semiconductor wafer is accordance with the predicted shift measurement value.

A third aspect of the invention provides a pick and place apparatus comprising a processor coupled to a computer-readable memory unit, the memory unit comprising instructions that when executed by the computer processor implements an automated semiconductor device placement improvement method comprising: automatically executing, by the processor, a shift measurement associated with an offset from an original placement of a plurality of semiconductor die of a semiconductor wafer for processing; retrieving, by the processor, a shift measurement value associated with the shift measurement; storing, by the processor in a database, the shift measurement value, wherein the database comprises a plurality of previously retrieved shift measurement values associated with previously measured shift measurements for offsets from an original placement for a previous plurality of semiconductor die of a previous plurality of semiconductor wafers for processing; executing, by the processor, specified models with respect to the shift measurement value and the plurality of previously retrieved shift measurement values; determining, by the processor based on results of the executing, a predicted shift measurement value associated with a future offset for a new plurality of semiconductor die on a new semiconductor wafer for processing; and automatically placing, by the processor, placement hardware of the pick and place apparatus in multiple positions for generating the new plurality of semiconductor die on the new semiconductor wafer is accordance with the predicted shift measurement value.

The present invention advantageously provides a simple method and associated system capable of mass-producing integrated circuit packages.

DETAILED DESCRIPTION

Figure 1:
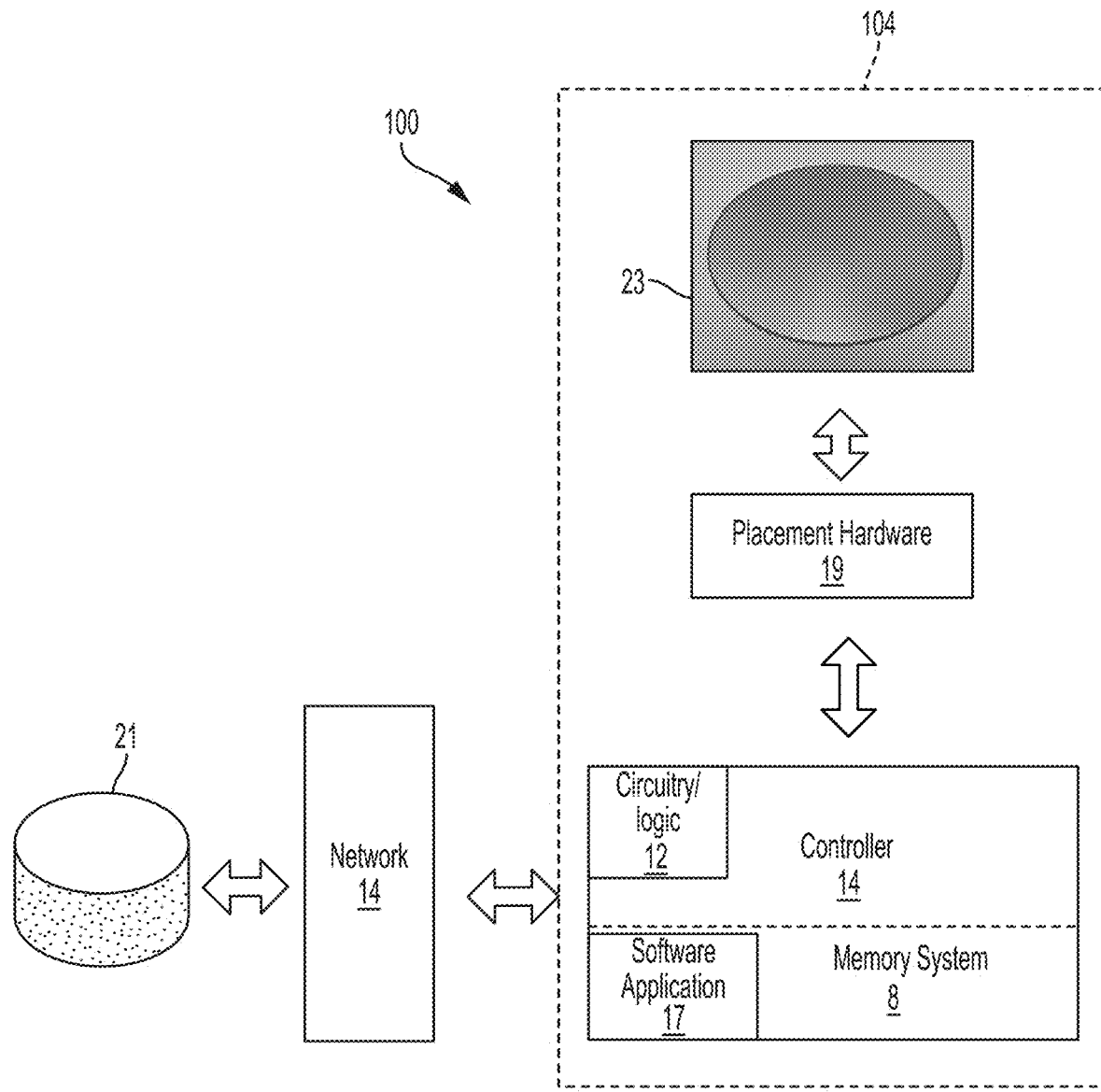
FIG. 1 illustrates a system for improving a semiconductor fabrication process by mathematically modeling, predicting, and adjusting placement of dies of semiconductor material of an integrated circuit to compensate for stochastically driven shifts in die placement, in accordance with embodiments of the present invention.

FIG. 1 illustrates a system 100 for improving a semiconductor fabrication process by mathematically modeling, predicting, and adjusting placement of dies of semiconductor material of an integrated circuit to compensate for stochastically driven shifts in die placement, in accordance with embodiments of the present invention. System 100 is enabled to combine multiple fitting software applications (comprising specialized software code) executing several combined algorithms (e.g., a polynomial fitting algorithm, a transcendental fitting algorithm, a trigonometric fitting algorithm, a piecewise fitting algorithm, a single and multivariable fitting algorithm, etc.) for generating a best fit die placement process for a specific semiconductor fabrication run based multiple historic inputs. System 100 allows a die placement process to be performed with respect to a chip carrier of any size of shape. Additionally, system 100 enables a process for adjusting multiple spindles (of a pick and place machine) to account for offset differences between spindles.

A description of the hereinafter described embodiments of the disclosed systems, method and tools are presented by way of exemplification and not limitation with reference to the drawings or provided images.

System 100 of FIG. 1 includes a (semiconductor) pick and place apparatus 104 connected to a database system 21 through a network 7. Pick and place apparatus 104 comprises a controller 14, placement hardware 19 (e.g., a robotic arm), and a spindle assembly 23 for semiconductor wafer placement. Controller 14 comprises control circuitry/logic 12 and a memory system 8. Memory system 8 comprises generated software code 17. Pick and place apparatus 104 may comprise an embedded device. An embedded device is defined herein as a dedicated device or computer comprising a combination of computer hardware and software (fixed in capability or programmable) specifically designed for executing a specialized function. Programmable embedded computers or devices may comprise specialized programming interfaces. In one embodiment, pick and place apparatus 104 may comprise a specialized hardware device comprising specialized (non-generic) hardware and circuitry (i.e., specialized discrete non-generic analog, digital, and logic based circuitry) for (independently or in combination) executing a process described with respect to FIGS. 1-19. The specialized discrete non-generic analog, digital, and logic based circuitry (e.g., circuitry/logic 15, etc.) may include proprietary specially designed components (e.g., a specialized integrated circuit, such as for example an Application Specific Integrated Circuit (ASIC) designed for only implementing an automated process for improving a semiconductor fabrication process by mathematically modeling, predicting, and adjusting placement of dies of semiconductor material of an integrated circuit to compensate for stochastically driven shifts in die placement. The memory system 8 may include a single memory system. Alternatively, the memory system 8 may include a plurality of memory systems. Network 7 may include any type of network including, inter alia, a local area network, (LAN), a wide area network (WAN), the Internet, a wireless network, etc.

Embodiments of the present disclosure provides for systems, methods and tools which may offer a reliable way to compensate for shifts in die placement by using mathematical models to predict the likelihood of future displacements based on historical data collected from measuring the shifts that may have previously occurred in the past consistent with the embodiments described herein. The predicted values may be used to re-adjust the nominal values of the die or wafer placement so to negate or minimize the stochastic effects.

The method, systems, and tools disclosed herein may incorporate various techniques and features beyond the standardized regression technique, for example, by combining several types of mathematical fitting models including but not limited to, polynomial, transcendental, trigonometric, piecewise, single, multivariable and others know by those skilled in the art. Embodiments of the mathematical models may be applied to generate a best fit scenario for a particular production run. In some embodiments, the best fit scenario applied to the mathematical model selected may be based on a single or multiple historical inputs previously inputted into the system creating the integrated circuit. The following discloses a more detailed list of fitting models that may be used or performed by the systems, methods and tools of the present disclosure. The following list illustrates examples of software code based mathematical fitting models associated with global (molding) and local (head, spindle) models:

1. One dimensional fit models such as, inter alia, polynomial models (e.g., constant, linear, quadratic, cubic, etc), transcendental models (exponential, logarithmic, etc), piecewise models (poly, trans, spline, Bezier, etc), manual input models (e.g., offset, curve, blending, and shifting), etc.
2. Two dimensional fit models such as, inter alia, multivariable polynomial input models, transcendental input models, thin plate spline (TPS) regularized/non-regularized input models, manual input models (offset, surface drag, etc), etc.

In some embodiments, a mathematical model utilized may comprise a polynomial regression model. The polynomial regression model may be a form of linear regression where a relationship between the independent variable x and the dependent variable y may be modeled as an "nth" degree polynomial. An associated solution to the polynomial regression model may be provided as follows:

1. A solution to the series $f_i(x_i) = \varepsilon_i + \Sigma_{k=0}^{m} a_k x_i^k$, $i \in \{1 \ldots n\}$ of data points $f_i(x_i)$ minimizes the squares of $\varepsilon_i$, AKA least-squares approximation.
2. The aforementioned series may be converted to a vector/matrix form as follows:

$$f_i(x_i), i \in \{1 \ldots n\} \to \vec{f} \equiv (f_1, f_2, \ldots, f_n)^T x_i^k \to \begin{pmatrix} 1 & x_1 & x_1^2 & \ldots & x_1^m \\ 1 & x_2 & x_2^2 & \ldots & x_2^m \\ \ldots & \ldots & \ldots & \ldots & \ldots \\ 1 & x_n & x_n^2 & \ldots & x_n^m \end{pmatrix}$$

$$a_k, k \in \{a_0, \ldots a_m\}^T$$

3. A resulting solution is obtained by e.g., applying Gauss-Jordan elimination to $\vec{a} = (X^T X)^{-1} X^T \vec{f}$ to obtain the coefficients $a_k$.

In some embodiments, a mathematical modeling algorithm may comprise a combination of exponential and logarithmic regression techniques which may be very similar to the polynomial regression model as described above. However, under the exponential/logarithmic regression algorithm, the mathematical function may be first exponentiated or taken the logarithm of, followed by performing the rest of the procedure similar to the polynomial regression.

As noted above in the list of software code based mathematical fitting models, examples of a one-dimensional fitting model (one dimensional fit) may further include piecewise fittings. Examples of piecewise spline and piecewise Bezier fitting solutions are demonstrated as follows with respect to FIG. 2 and FIG. 3, infra.

Figure 2:
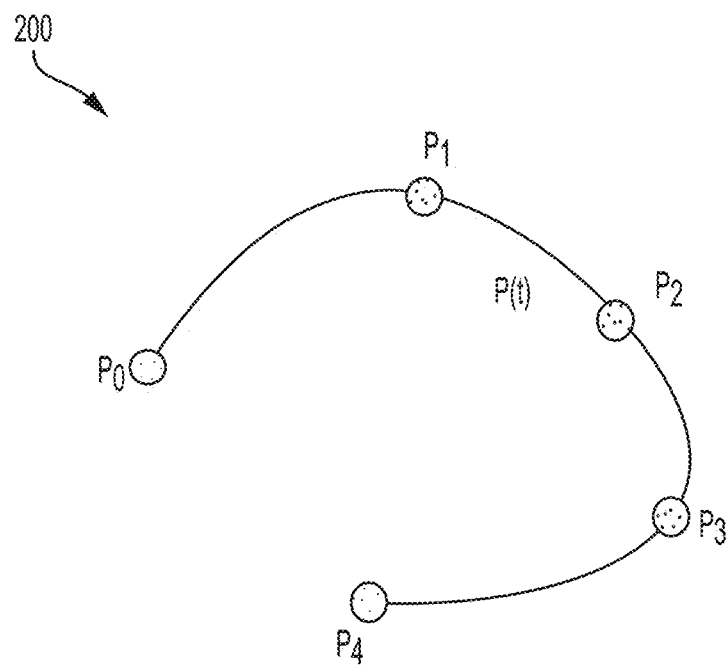
FIG. 2 illustrates a non-regularized case associated with a piecewise spline curve executed by the system of FIG. 1 for executing a bi-cubic spline, in accordance with embodiments of the present invention.

FIG. 2 illustrates a non-regularized case associated with a piecewise spline curve 200 executed by system 100 of FIG. 1 executing a bi-cubic spline, in accordance with embodiments of the present invention. A solution to the conditions of spline curve 200 may be provided by the following set of cubic polynomials providing an exact interpolation:

1. $\lim_{x \to p_i^+} f(x) = \lim_{x \to p_i^-} f(x)$

Figure 3:
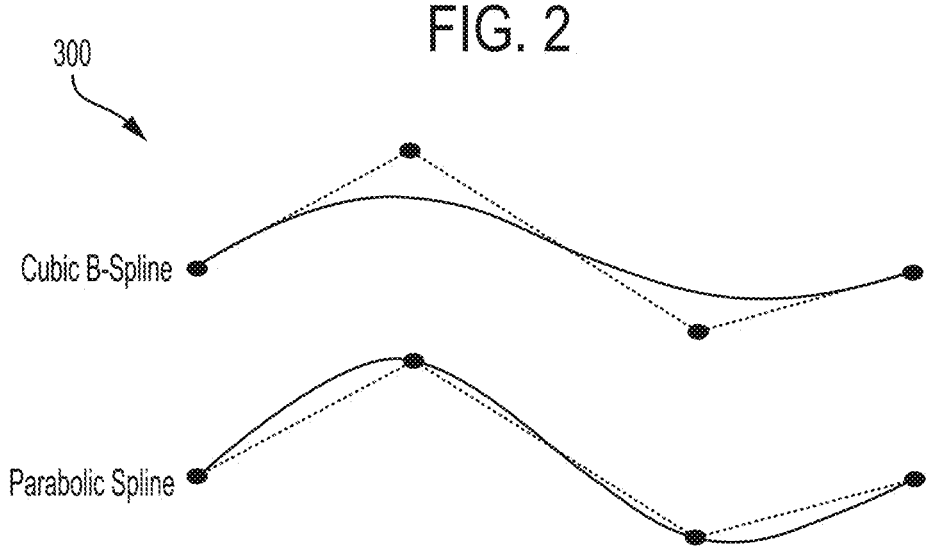
FIG. 3 illustrates a piecewise Bezier curve executed by the system of FIG. 1 for improving a semiconductor fabrication process, in accordance with embodiments of the present invention.

2. $\lim_{x \to p_i^+} \frac{\partial f}{\partial x} = \lim_{x \to p_i^-} \frac{\partial f}{\partial x}$ FIG. 3 illustrates a piecewise Bezier curve 300 executed by system 100 of FIG. 1 for improving a semiconductor fabrication process, in accordance with embodiments of the present invention.

Figure 4:
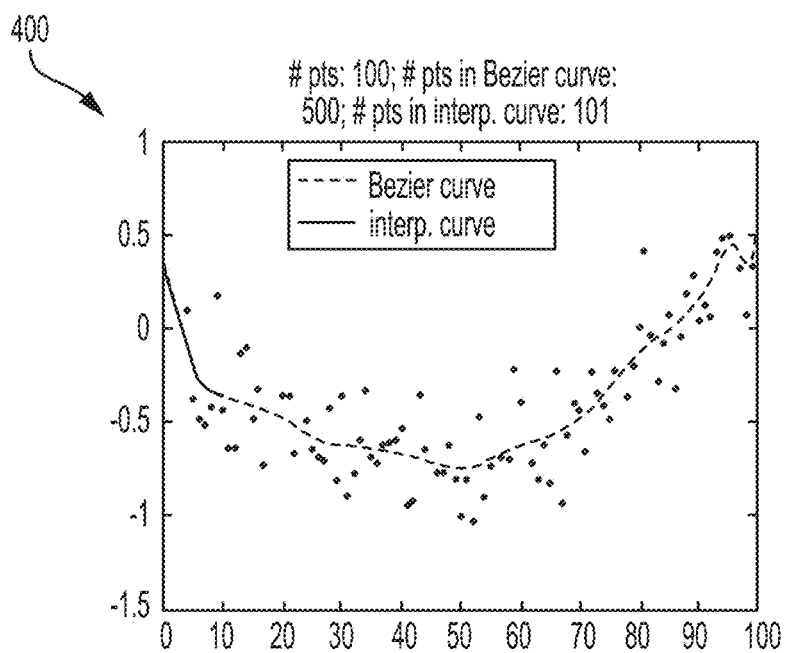
FIG. 4 illustrates a graph representing piecewise Bezier curve executed by the system of FIG. 1 for improving a semiconductor fabrication process, in accordance with embodiments of the present invention.

FIG. 4 illustrates a graph 400 representing piecewise Bezier curve 300 executed by system 100 of FIG. 1 for improving a semiconductor fabrication process, in accordance with embodiments of the present invention. Graph 400 illustrates an approximated fitting to account for random noise in the data.

Figure 5:
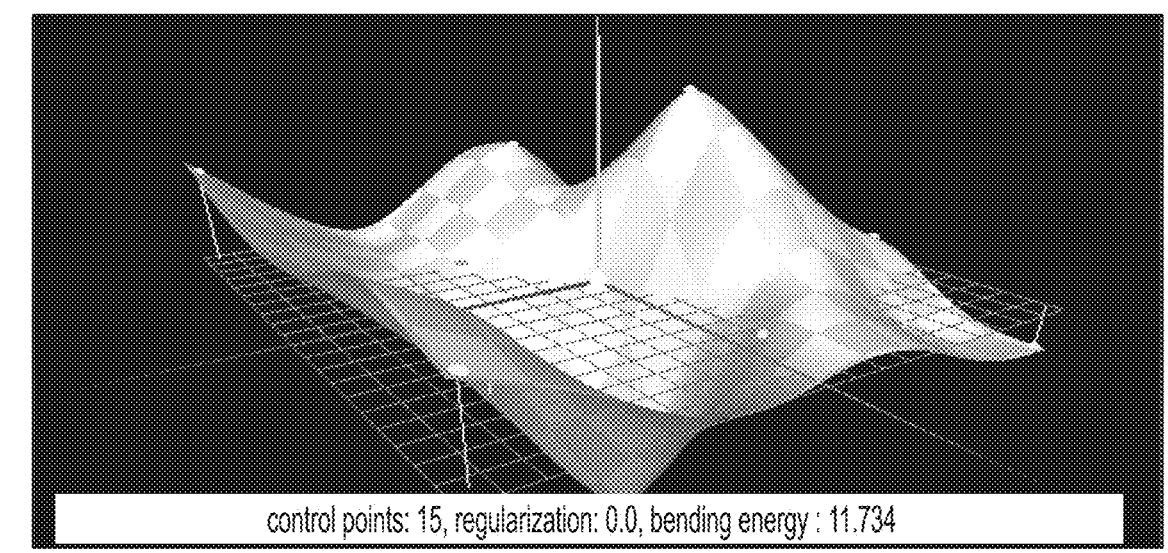
FIG. 5 illustrates a Thin-Plate Spline (TPS) model executed by the system of FIG. 1 for improving a semiconductor fabrication process, in accordance with embodiments of the present invention.

FIG. 5 illustrates a TPS 501 model executed by system 100 of FIG. 1 for improving a semiconductor fabrication process, in accordance with embodiments of the present invention. TPS 500 model allows a two dimensional surface fitting (two dimensional surface fitting) algorithm to be applied by the systems, methods, and tools of the present invention. For example, in an exemplary embodiment, TPS model 500 may be used to generate a smooth interpolation for generating a minimally blended surface that passes through all points of arbitrary (non ordered) locations.

Figure 6:
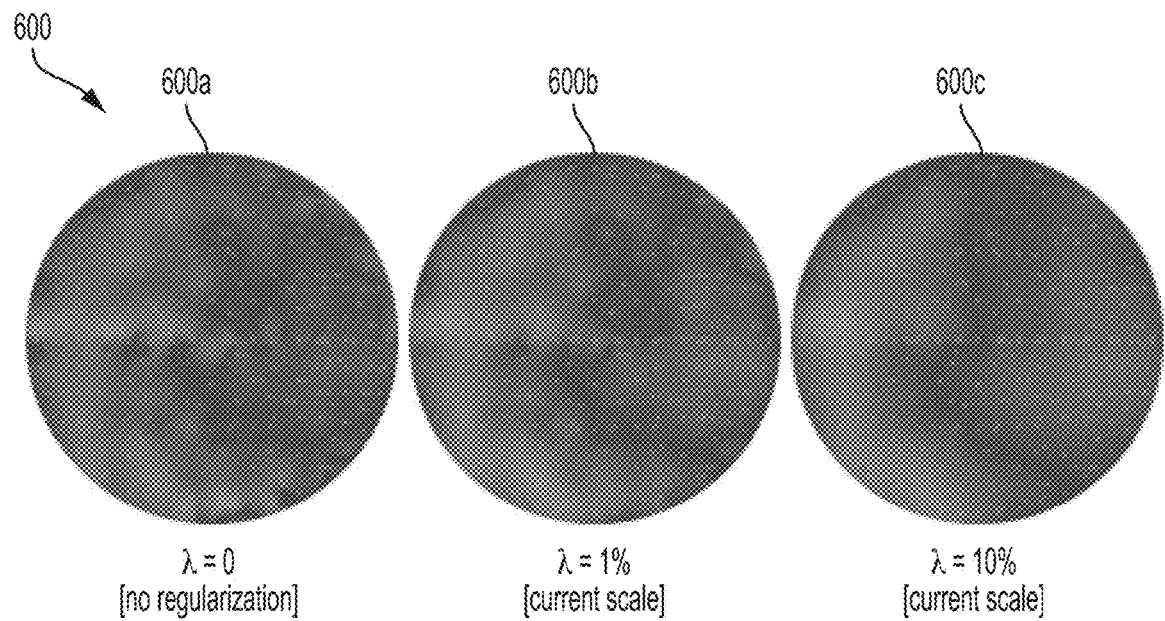
FIG. 6 illustrates wafers associated with a TPS fitting model, in accordance with embodiments of the present invention.

FIG. 6 illustrates wafers 600*a*, 600*b*, and 600*c* associated with a TPS fitting model, in accordance with embodiments of the present invention. Executing a TPS fitting model may comprise a similar process as a piecewise polynomial model with the following exception: the mathematical model may be expanded into two dimensions such that the fitted values may comprise dual-variable functions of x and y simultaneously, instead of comprising a single variable function having an independent x and y (e.g., one dimensional polynomials). Embodiments employing a TPS fitting model may control whether the surface should pass through all of the points exactly or within a certain proximity in order to account for noise and prevent interpolation artifacts through the use of regularization techniques. Regularization techniques are illustrated as follows:
1. Wafer 600a comprises no regularization.
2. Wafer 600b comprises a current scale regularization of 1%.
3. Wafer 600c comprises a current scale regularization of 10%.

In some embodiments of the TPS fitting model, the fitting may be limited to a single parameter such as a height. In other embodiments, that are a multi-dimensional fittings, multiple models may be used simultaneously. A λ-parameter relaxes a surface wafers 600a, 600b, and 600c making it less prone to local noise wrinkles. Embodiments of the TPS fitting may be defined as follows:

The fitted surface values z(x, y) are given via: $z(x, y) = a_1 + a_2 x + a_3 y + \sum_{i=1}^{n} w_i U(|c_i - x_i|)$, where $x_i \equiv (x, y)$ comprise the fitted points, $c_i \equiv (c_x, c_y)_i$ comprises the control points, $$U(r) \equiv \begin{cases} r^2 \log r, & r > 0 \\ 0, & r = 0 \end{cases} \text{ comprises a } TPS \text{ base function,}$$

and
$(a_1, a_2, a_3)$ comprises the vector set of global coefficients.

Additionally, an important property of a z(x, y) function is that it minimizes the bending energy as follows:

$$E = \iint_{\square^2} \left[ \left(\frac{\partial^2 z}{\partial x^2}\right) + 2\left(\frac{\partial^2 z}{\partial x \partial y}\right) + \left(\frac{\partial^2 z}{\partial y^2}\right) \right] dx dy$$

Therefore, the interpolation is enabled to achieve a necessary smoothness.

A solution to a TPS fitting process is described follows:
In order to locate the vectors $a \equiv (a_1, a_2, a_3)^T$ and $(w_1, \ldots, w_n)^T$, the following equation must be solved:

$$\begin{pmatrix} K & P \\ P^T & 0 \end{pmatrix} \cdot \begin{pmatrix} w \\ a \end{pmatrix} = \begin{pmatrix} v \\ 0 \end{pmatrix}$$

Thereby involving an inversion of the matrix $$L \equiv \begin{pmatrix} K & P \\ P^T & 0 \end{pmatrix}$$

Additionally, a vector $v \equiv (z_{c1}, \ldots, z_{cn})$ consists of the z-values at each of the n control points. 0 comprises a zero-valued 3×1 vector/3×3 matrix and a K-matrix comprises an n×n matrix given by the following:

$$K_{ij} = U|c_i - c_j| + I_{ij} \cdot \alpha^2 \lambda$$

$$\alpha \equiv \frac{1}{p^2} \sum_{i=1}^{p} \sum_{j=1}^{p} |c_i - c_j|$$

with λ being the regularization parameter (i.e., user-input).

A $P^{(3 \times 3)}$ matrix contains the control points data as follows:

$$P^{(3 \times 3)} = \begin{cases} P_{i1} = 1 \\ P_{i2} = c_{i,x} \\ P_{i3} = c_{i,y} \end{cases}$$

Embodiments of the TPS fitting algorithm may be defined as follows:
1. Calculate matrix elements $U(|c_i - c_j|)$ for each pair of control points $c_i$, $c_j$
2. Calculate a diagonal value α
3. Generate a matrix $$L^{((n=3) \times (n+3))} \equiv \begin{pmatrix} K & P \\ P^T & 0 \end{pmatrix}$$

4. Solve a matrix equation by locating the inverse of L and multiplying both sides by the inverse to obtain $$\begin{pmatrix} w \\ a \end{pmatrix} = L^{-1} \cdot \begin{pmatrix} v \\ 0 \end{pmatrix}$$

5. Solve for z(x,y), for each point on the fitting grid.

Figure 7:
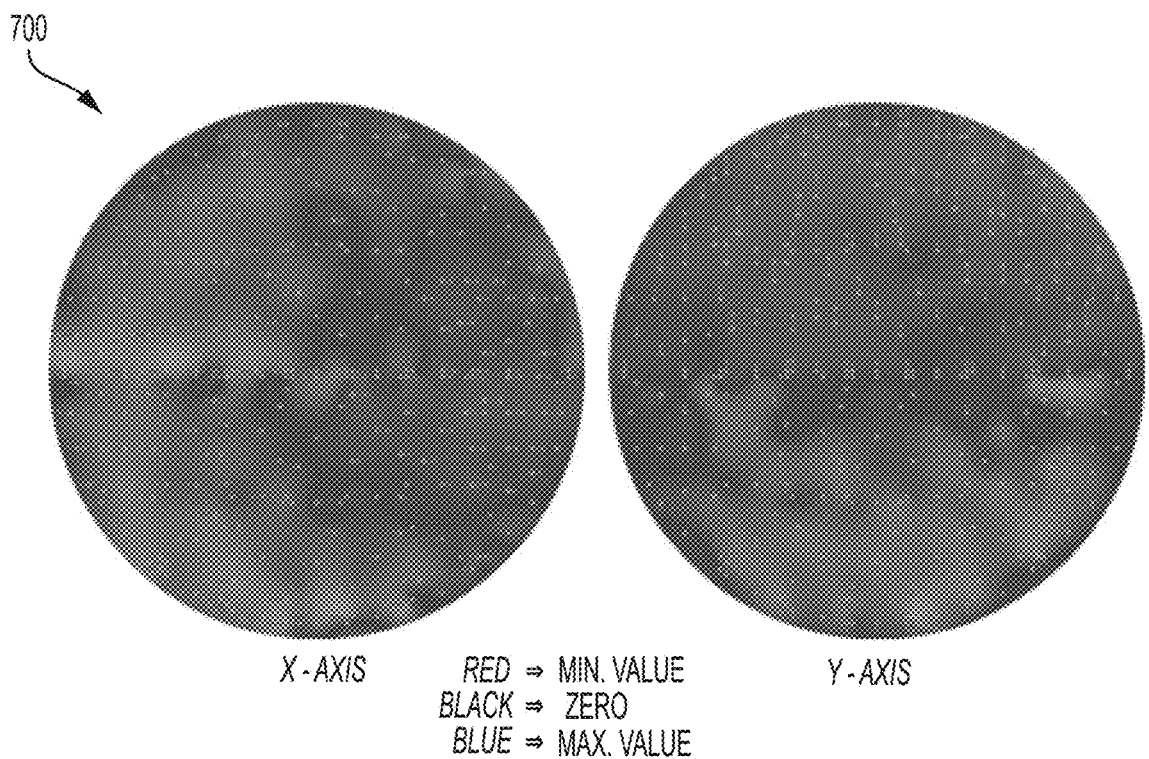
FIG. 7 illustrates a wafer associated with an X-axis and a Y-axis, in accordance with embodiments of the present invention.

FIG. 7 illustrates a wafer 700 associated with an X-axis and a Y-axis, in accordance with embodiments of the present invention. Wafer 700 may be configured to utilize a carrier (platform) of any size or shape. For example, a carrier comprising a rounded, a square, a rectangular etc. shape. In some embodiments, the systems, methods, and tools of the present invention may enable an adjustment or trim of multiple spindles of a pick and place apparatus. Additionally, placement locations of spindles may be grouped together or grouped in specified arrangements resulting in spindle to spindle differences. Furthermore, systems, tools, and methods described herein may include specified modeling algorithms offering a precise and near-perfect fit of the dies thereby accommodating for virtually all future variations in production to be within a standard error thereby reducing or eliminating observable stochastic effects. Additionally, a projected process efficiency of the systems may be limited only by natural white-noise variations measured within the equipment's repeatability. Any repeatable transformations that may occur may be fully adjusted for. Furthermore, embodiments of the mathematical models may allow for combining input and/or output data produced from several runs of the system to further improve the accuracy of the system and the associated modeling algorithms. Moreover, embodiments of the systems, methods and tools described herein may be fully automated. Hence the systems, methods, and tools may perform requested tasks in a reduced amount of time and may further reduce the manpower required for performing the task.

In some embodiments of the methods, systems, and tools described herein, it may be possible to use spreadsheet software or alternative software tools to re-create a modeling algorithm. Subsequently, a semiconductor product being produced by the system may be modified via manual data entry. In an alternative embodiment, a series of trial-and-error runs of the system, method, and tools may be performed with the help of an automated measurement device, such as an AOI. An AOI may provide a sufficient amount of data to perform large-scale statistical analysis and corrective pattern generation in view of the information provided as a result of the trial and error runs or by using historical data from previous production runs. Wafer 700 provides an example of a TPS fitting with AOI data and projection of the product data accounting for product displacement.

Figure 8:
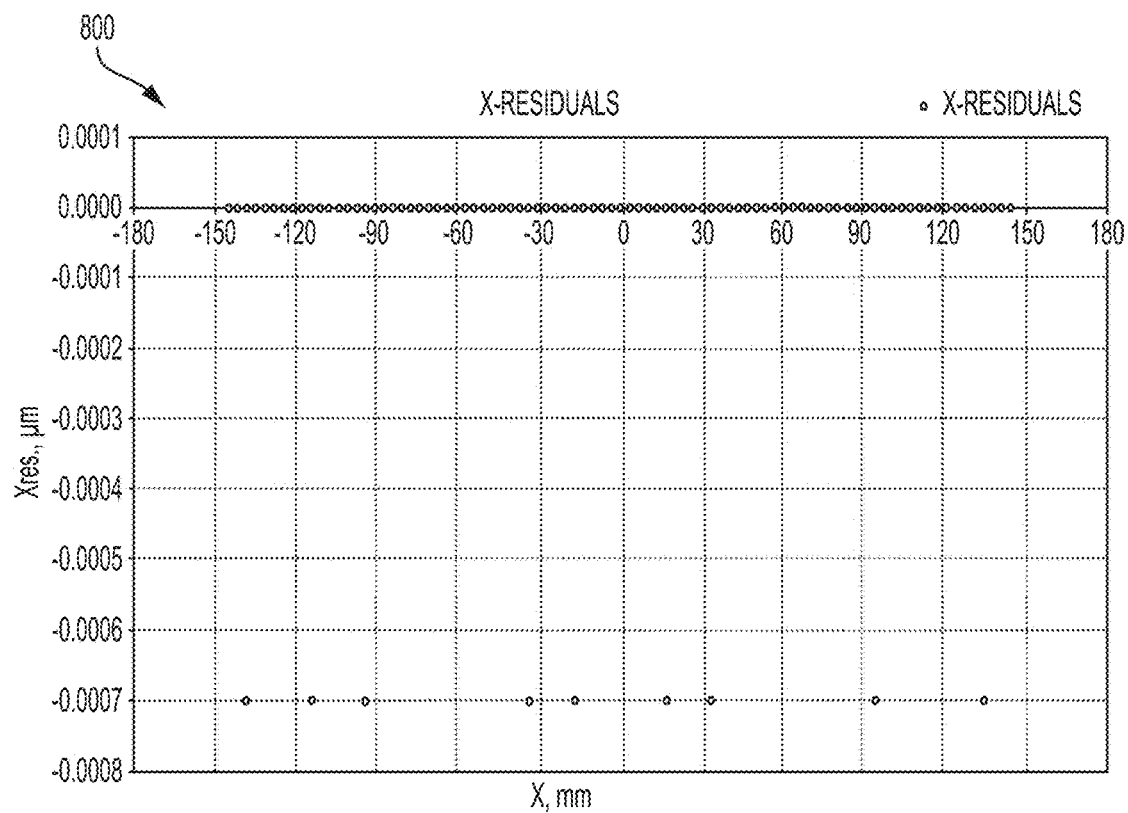
FIG. 8 illustrates a graph representing a simulation associated with X-axis residuals with respect to the wafer of FIG. 7, in accordance with embodiments of the present invention.

FIG. 8 illustrates a graph 800 representing a simulation associated with X-axis residuals with respect to wafer 700 of FIG. 7, in accordance with embodiments of the present invention.

Figure 9:
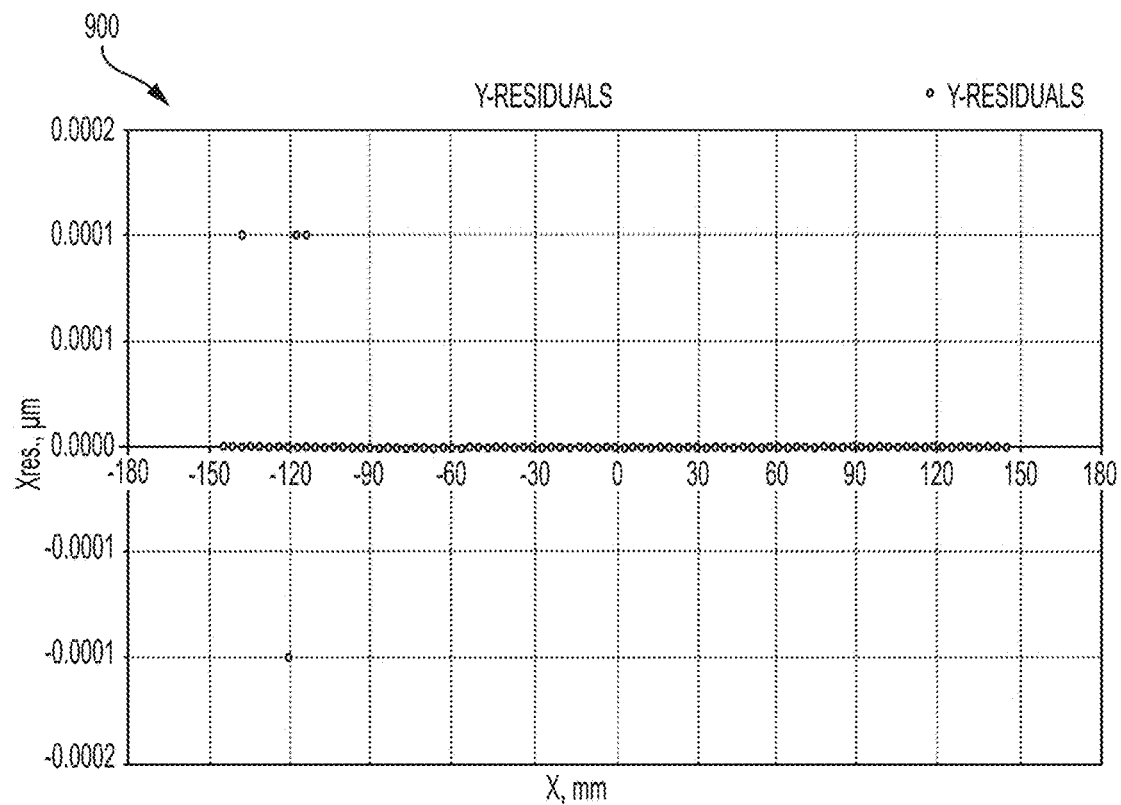
FIG. 9 illustrates a graph representing a simulation associated with Y-axis residuals with respect to the wafer of FIG. 7, in accordance with embodiments of the present invention.

FIG. 9 illustrates a graph 900 representing a simulation associated with Y-axis residuals with respect to wafer 700 of FIG. 7, in accordance with embodiments of the present invention.

Figure 10:
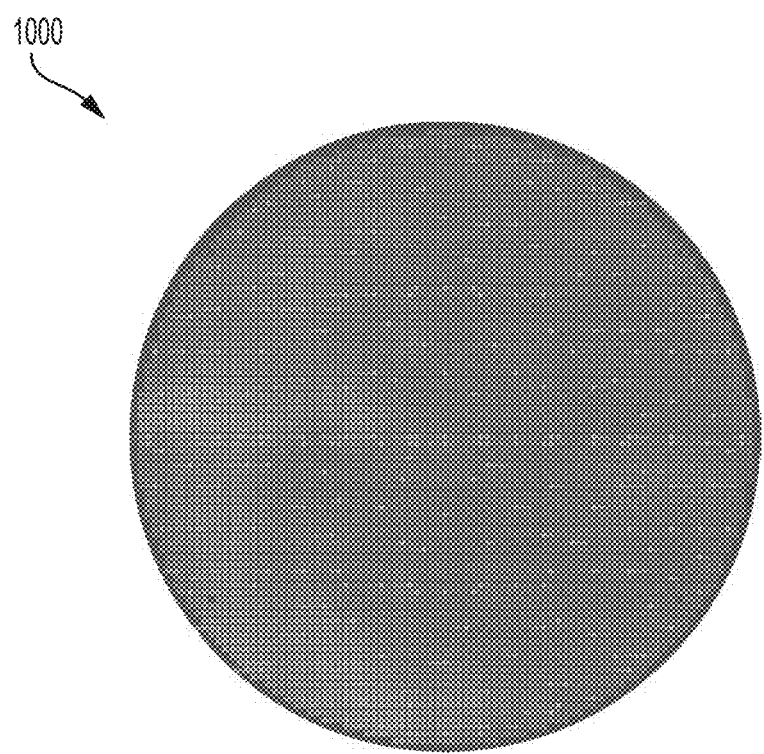
FIG. 10 illustrates a wafer associated with a TPS projection, in accordance with embodiments of the present invention. Wafer 1000 illustrates a projection associated with die product displacements.

FIG. 10 illustrates a wafer 1000 associated with a TPS projection, in accordance with embodiments of the present invention. Wafer 1000 illustrates a projection associated with die product displacements.

Figure 11:
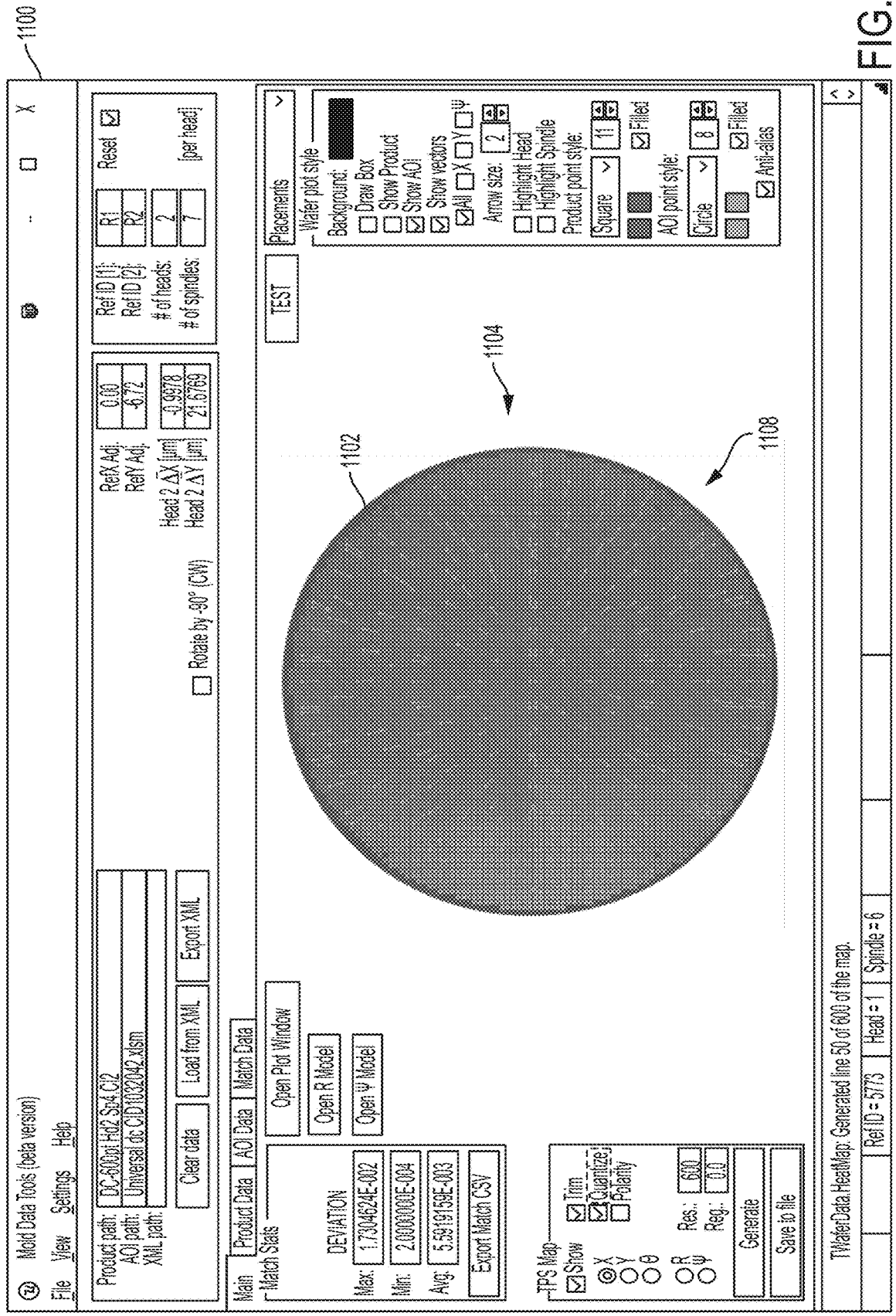
FIG. 11 illustrates a graphical user interface (GUI), in accordance with embodiments of the present invention.

FIG. 11 illustrates a graphical user interface (GUI) 1100 wafer 1000, in accordance with embodiments of the present invention. GUI 1100 may be compatible with most operating system environments and does not require any 3$^{rd}$ party installations. GUI 1100 is configured to present graphical and interactive representations of a wafer 1102, die 1104, and reference points 1108 (i.e., AOI). The interactive representations of GUI 1100 may enable scalable and interactive plotting (linear, vector, surface, etc.) processes and provide an ability to segregate a die fitting on a per-axis, per-head, per-spindle basis, and individual point basis. Additionally, GUI 1100 provides the ability to manually adjust data by blending, shirting, or offsetting modeled values to any extent. GUI may be fully supported by CI1 and/or AOI/XLS formats and may allow for importing/exporting data from/to XML, and CSV formats. In some embodiments, the systems methods and tools described herein may be provided as software, computer code, programming code or machine code loaded into a computer system memory or memory device of the computer hardware.

Figure 12:
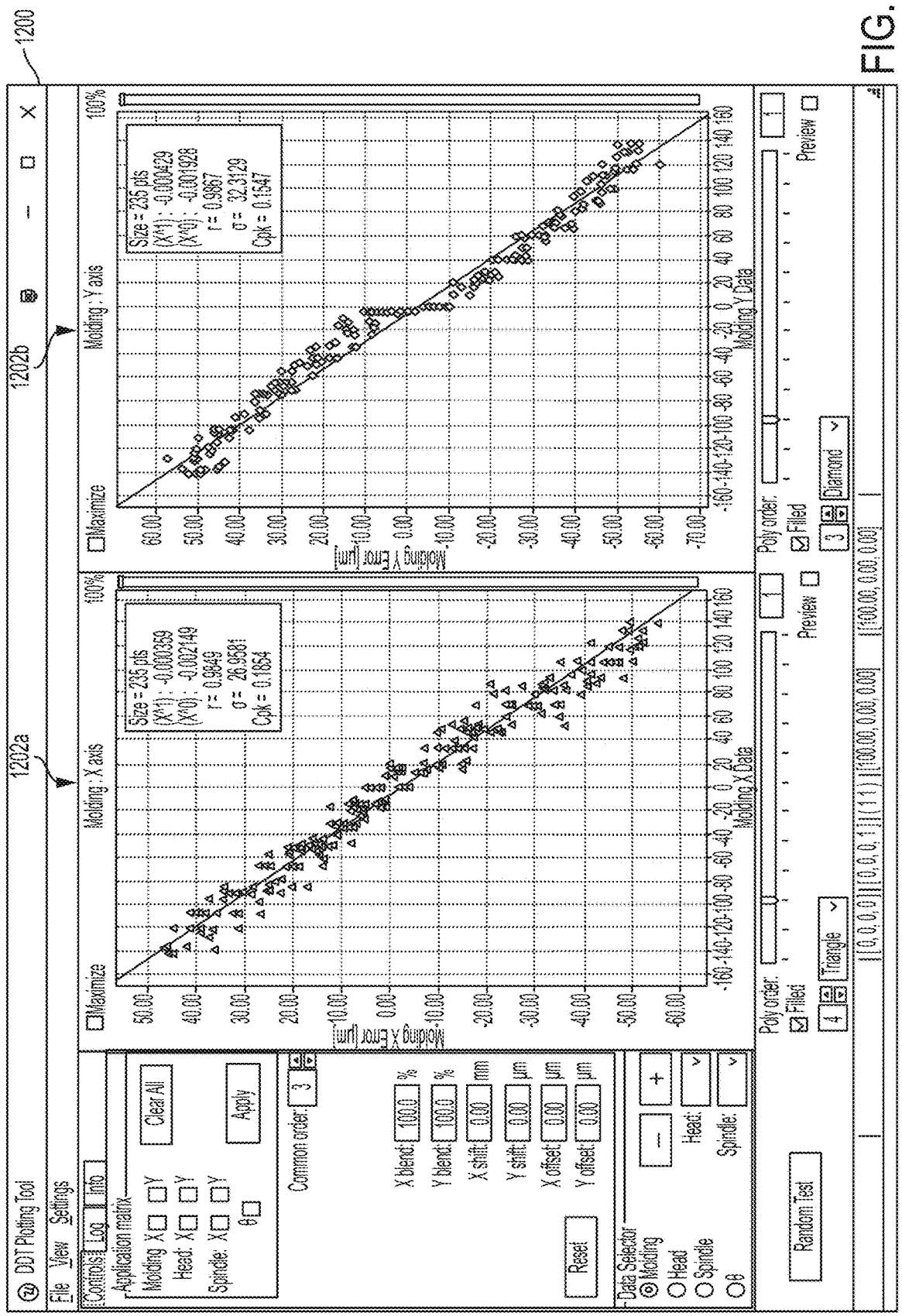
FIG. 12 illustrates an alternative GUI, in accordance with embodiments of the present invention.

FIG. 12 illustrates a GUI 1200, in accordance with embodiments of the present invention. GUI 1200 illustrates a data plot 1202a and a data plot 1202b for x and y moldings, respectively.

Figure 13:
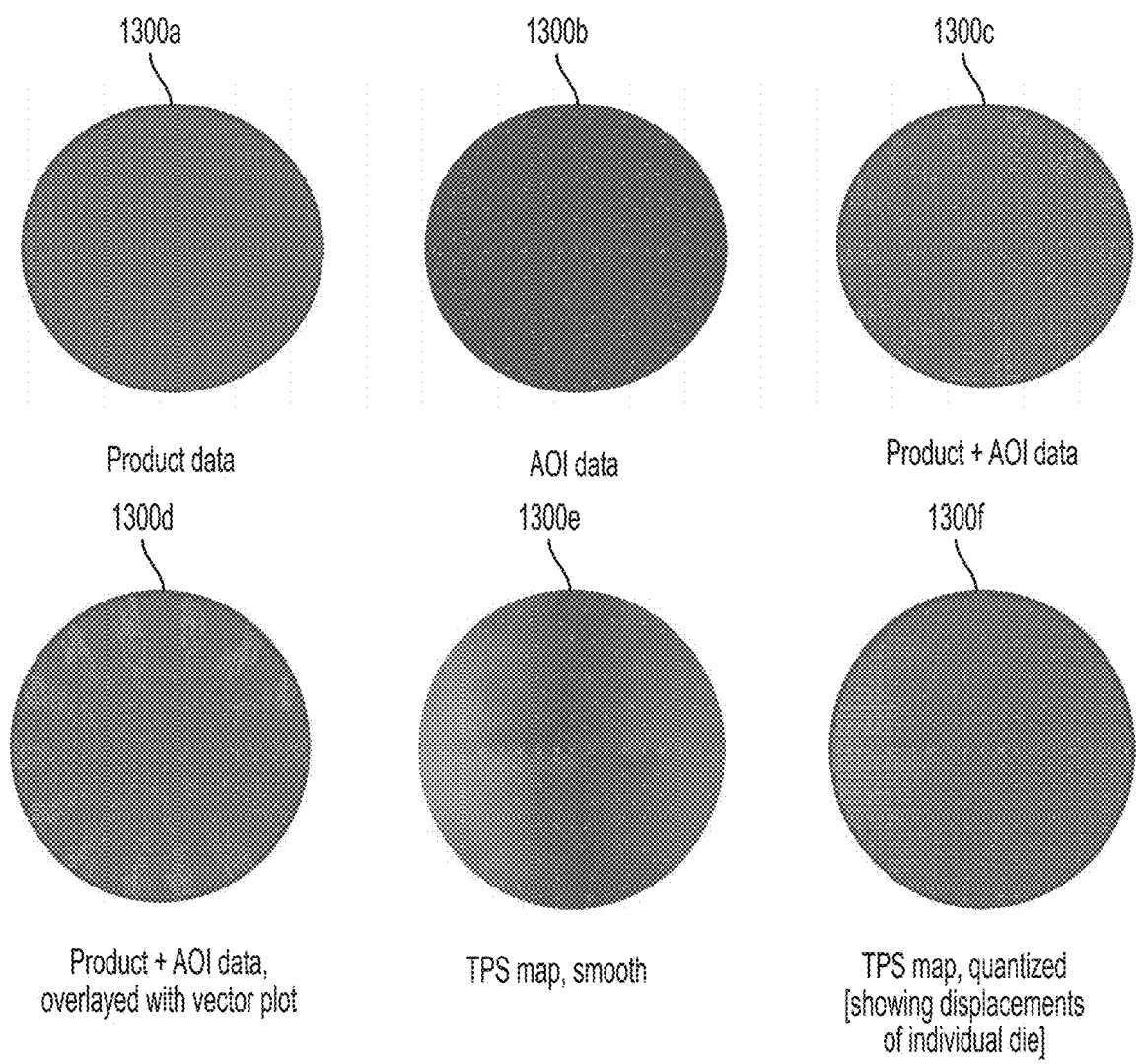
FIG. 13 illustrates wafer representations, in accordance with embodiments of the present invention.

FIG. 13 illustrates wafer representations 1300a . . . 1300f, in accordance with embodiments of the present invention. Wafer representation 1300a illustrates a product data representation. Wafer representation 1300b illustrates an AOI data representation. Wafer representation 1300c illustrates a product plus AOI data representation. Wafer representation 1300d illustrates a product plus AOI data representation overlaid with a vector plot. Wafer representation 1300e illustrates a TPS map smooth data representation. Wafer representation 1300f illustrates a TPS map quantized data representation illustrating individual die displacements.

Figure 14:
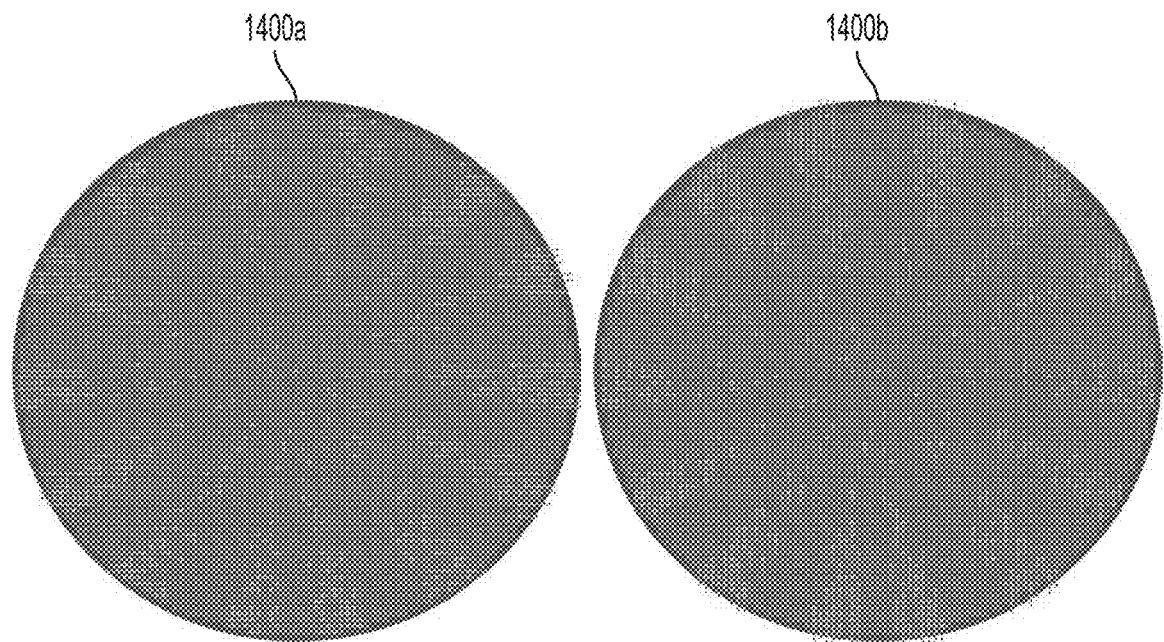
FIG. 14 illustrates alternative wafer representations, in accordance with embodiments of the present invention.

FIG. 14 illustrates wafer representations 1400a and 1400b, in accordance with embodiments of the present invention. Wafer representations 1400a and 1400b comprise a same vector plot with x (wafer representation 1400a) and y (wafer representation 1400b) directions.

Figure 15:
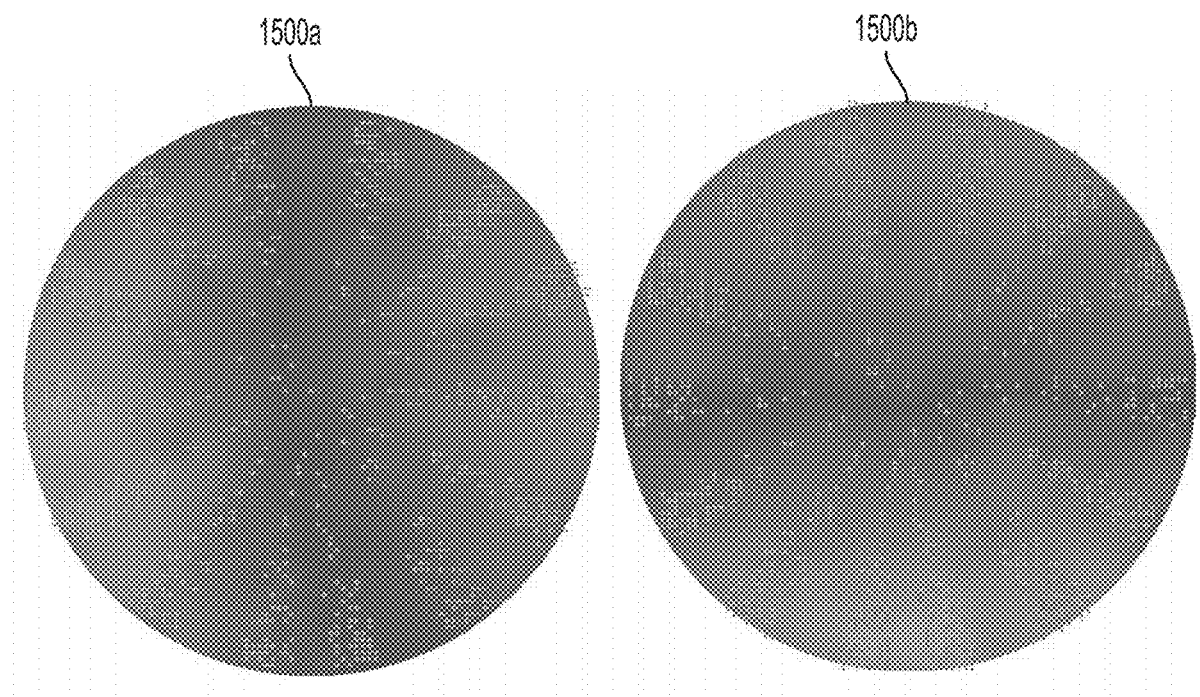
FIG. 15 illustrates additional wafer representations, in accordance with embodiments of the present invention.

FIG. 15 illustrates wafer representations 1500a and 1500b, in accordance with embodiments of the present invention. Wafer representations 1400a and 1400b comprise generated TPS maps in x and y coordinates overlaid by a vector plot.

Figure 16:
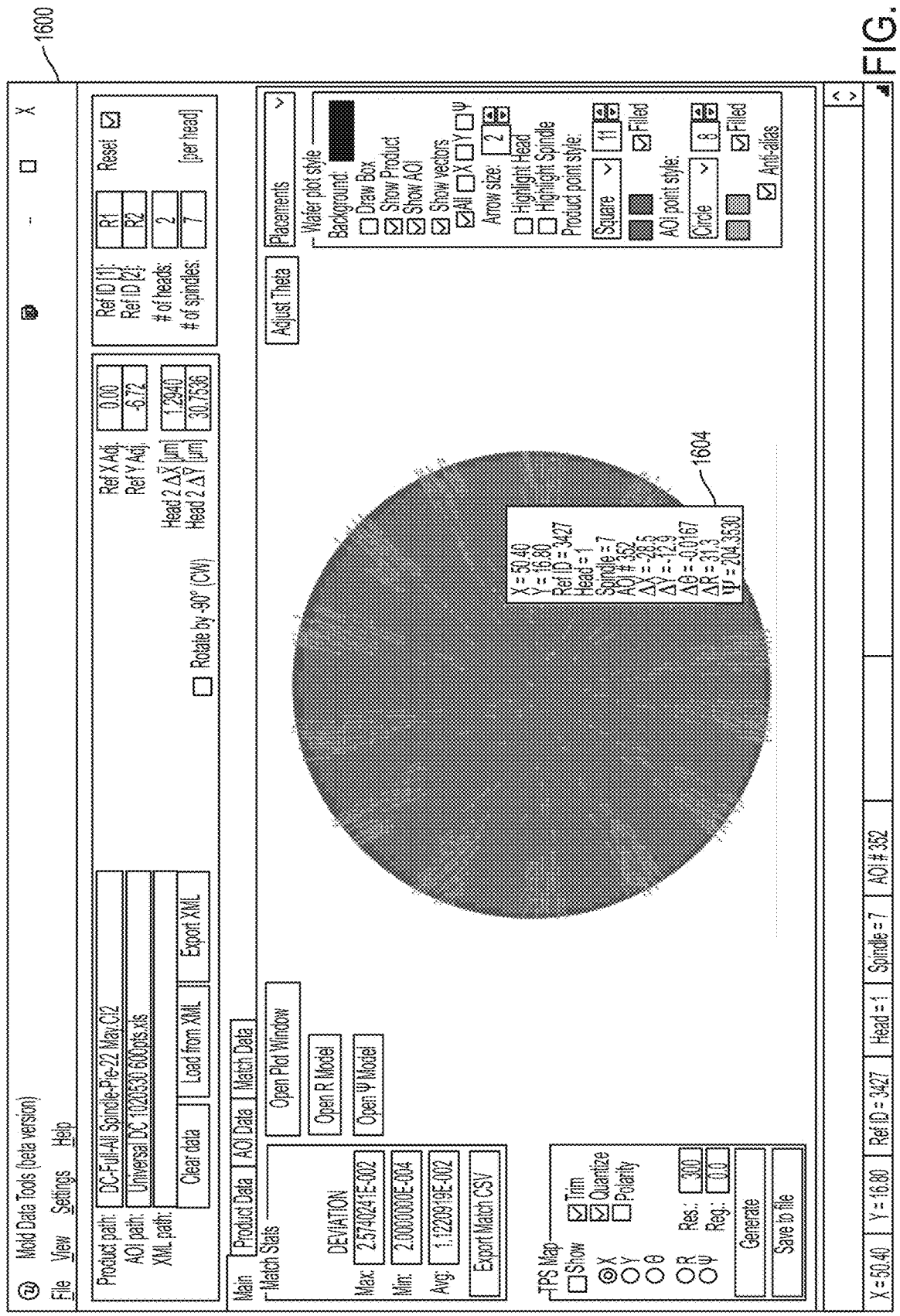
FIG. 16 illustrates a GUI, in accordance with embodiments of the present invention.

FIG. 16 illustrates a GUI 1600, in accordance with embodiments of the present invention. GUI 1600 presents an overall vector plot illustrating AOI point information under cursor portion 1604.

Figure 17:
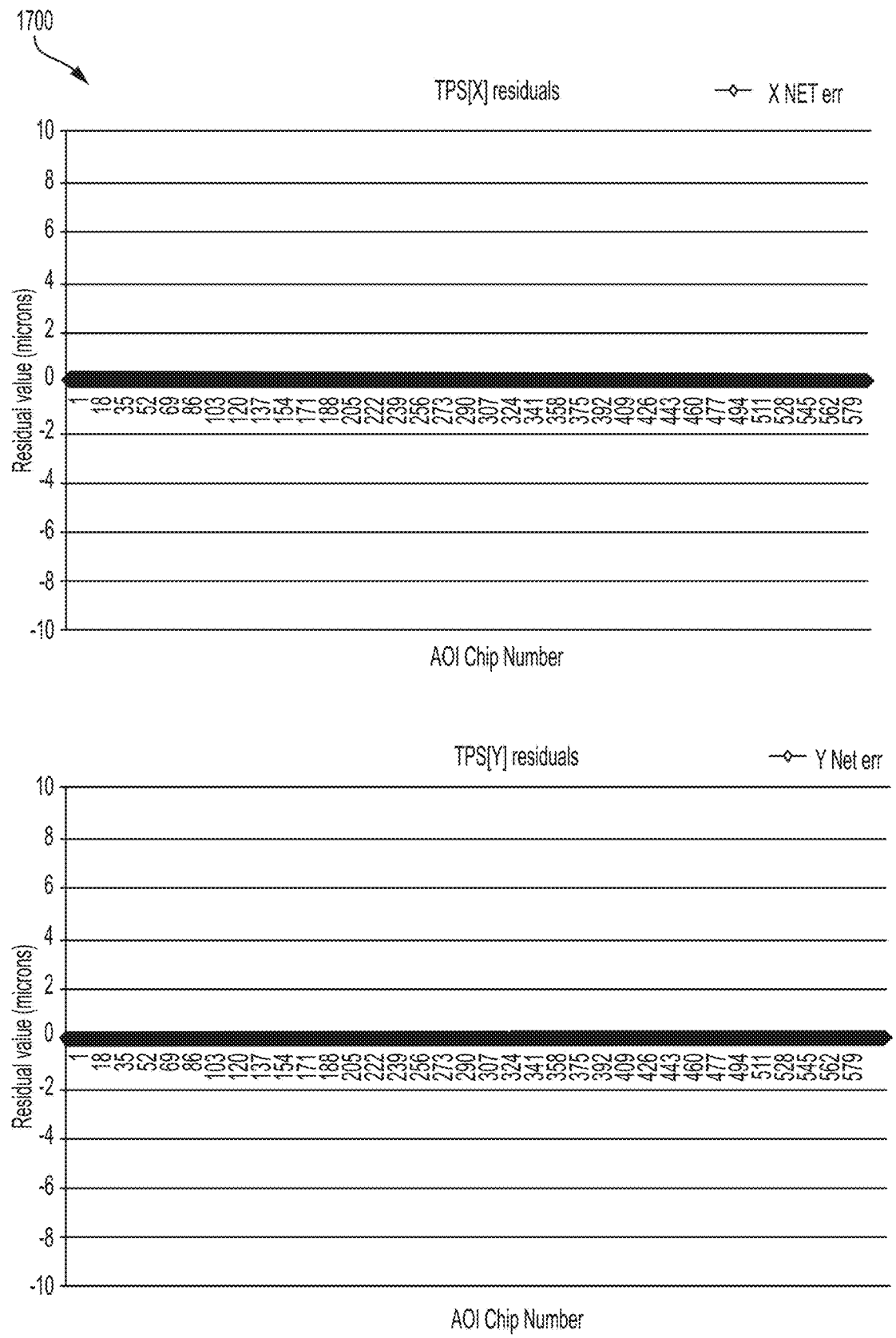
FIG. 17 illustrates a GUI, in accordance with embodiments of the present invention.

FIG. 17 illustrates a GUI 1700, in accordance with embodiments of the present invention. GUI 1700 presents simulated residuals after applying a TPS model.

Figure 18:
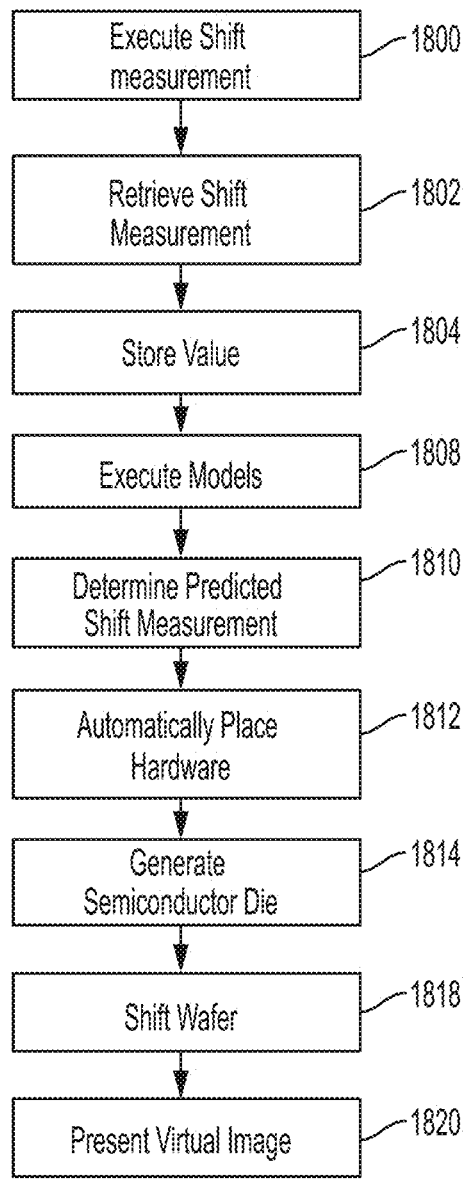
FIG. 18 illustrates an algorithm detailing a process flow enabled by the system of FIG. 1 for improving a semiconductor fabrication process by mathematically modeling, predicting, and adjusting placement of dies of semiconductor material of an integrated circuit to compensate for stochastically driven shifts in die placement, in accordance with embodiments of the present invention.

FIG. 18 illustrates an algorithm detailing a process flow enabled by system 100 of FIG. 1 for improving a semiconductor fabrication process by mathematically modeling, predicting, and adjusting placement of dies of semiconductor material of an integrated circuit to compensate for stochastically driven shifts in die placement, in accordance with embodiments of the present invention. Each of the steps in the algorithm of FIG. 18 may be enabled and executed in any order by a computer processor(s) executing computer code. Additionally, each of the steps in the algorithm of FIG. 18 may be enabled and executed by pick and place apparatus 104 of FIG. 1. In step 1800, a shift measurement associated with an offset from an original placement of a plurality of semiconductor die of a semiconductor wafer for processing is automatically executed. In step 1802, a shift measurement value associated with the shift measurement is retrieved. In step 1804, the shift measurement value is stored in a database. The database includes a stored plurality of previously retrieved shift measurement values associated with previously measured shift measurements for offsets from an original placement for a previous plurality of semiconductor die of a previous plurality of semiconductor wafers for processing. In step 1808, specified models are executed with respect to the shift measurement value and the plurality of previously retrieved shift measurement values. The specified models include mathematical models that may include one dimensional models (including polynomial models, transcendental models, piecewise models, manual input models, etc.) and two dimensional models (including multivariable polynomial models, thin plate spline models, manual input models, etc.). In step 1810, a predicted shift measurement value associated with a future offset for a new plurality of semiconductor die on a new semiconductor wafer for processing is determined based on results of step 1808. In step 1812, placement hardware (e.g., a robotic arm) of the said pick and place apparatus is automatically placed in multiple positions for generating the new plurality of semiconductor die on the new semiconductor wafer is accordance with the predicted shift measurement value. In step 1814, the new plurality of semiconductor die are generated within the new semiconductor wafer is accordance with the predicted shift measurement value. In step 1818, the new semiconductor wafer is automatically shifted in a plurality of new positions in accordance with the predicted shift measurement value. In step 1820, a virtual image of the new plurality of the semiconductor die on is presented (via a GUI) on the new semiconductor wafer.

Figure 19:
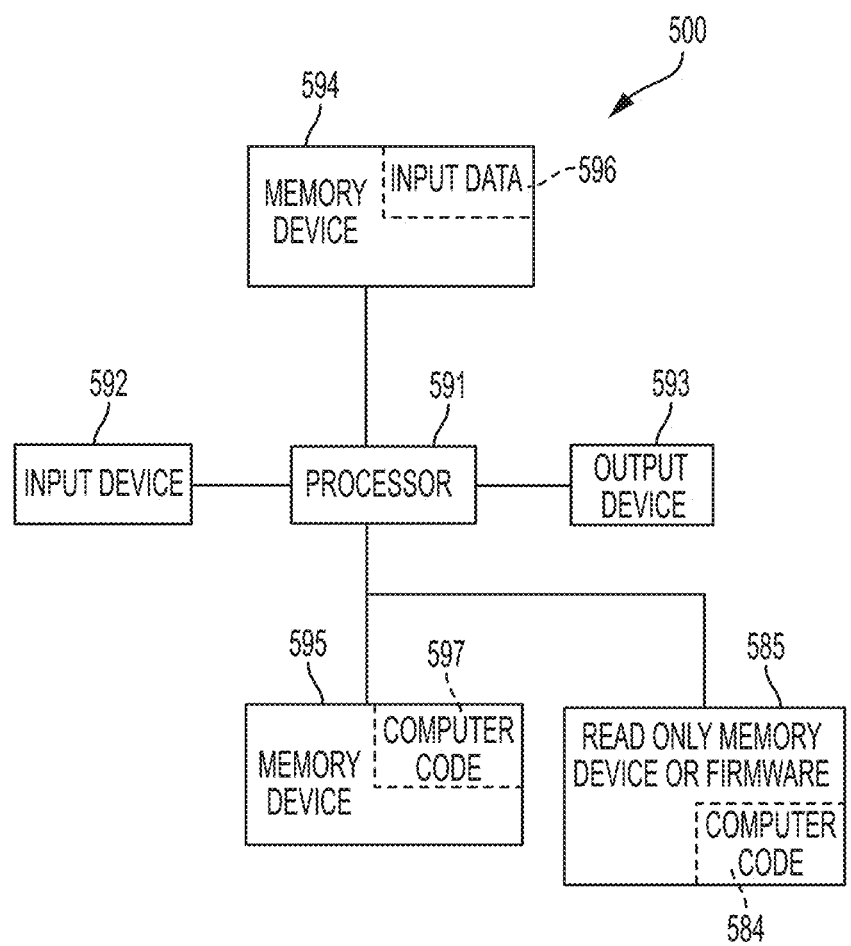
FIG. 19 illustrates a block diagram of a computer system that may be included as part of the system for implementing the methods of compensating for shifts in die placement using mathematical models in accordance with the embodiments of the present invention.

FIG. 19 illustrates a block diagram of a computer system 500 that may be included as part of the system for implementing the methods of compensating for shifts in die placement using mathematical models in accordance with the embodiments of the present disclosure. The computer system 500 may generally comprise a processor 591, an input device 592 coupled to the processor 591, an output device 593 coupled to the processor 591, and memory devices 594 and 595 each coupled to the processor 591. The input device 592, output device 593 and memory devices 594, 595 may each be coupled to the processor 591 via a bus. Processor 591 may perform computations and control the functions of computer 500, including executing instructions included in the computer code 597 for the tools and programs capable of methods of compensating for shifts in die placement using mathematical models, in the manner prescribed by the embodiments wherein the instructions of the computer code 597 may be executed by processor 591 via memory device 595. The computer code 597 may include software or program instructions that may implement one or more algorithms for implementing the methods of compensating for shifts in die placement using mathematical models, as described in detail above. The processor 591 executes the computer code 597. Processor 591 may include a single processing unit, or may be distributed across one or more processing units in one or more locations (e.g., on a client and server).

The memory device 594 may include input data 596. The input data 596 includes any inputs required by the computer code 597. The output device 593 displays output from the computer code 597. Either or both memory devices 594 and 595 may be used as a computer usable storage medium (or program storage device) having a computer readable program embodied therein and/or having other data stored therein, wherein the computer readable program comprises the computer code 597. Generally, a computer program product (or, alternatively, an article of manufacture) of the computer system 500 may comprise the computer usable storage medium (or said program storage device).

Embodiments of the computer code 597 and/or computer program product may include the following software loaded in one or more memory device of the computer system 500.

Memory devices 594, 595 include any known computer readable storage medium, including those described in detail below. In one embodiment, cache memory elements of memory devices 594, 595 may provide temporary storage of at least some program code (e.g., computer code 597) in order to reduce the number of times code must be retrieved from bulk storage while instructions of the computer code 597 are executed. Moreover, similar to processor 591, memory devices 594, 595 may reside at a single physical location, including one or more types of data storage, or be distributed across a plurality of physical systems in various forms. Further, memory devices 594, 595 can include data distributed across, for example, a local area network (LAN) or a wide area network (WAN). Further, memory devices 594, 595 may include an operating system (not shown) and may include other systems not shown in FIG. 1.

In some embodiments, the computer system 500 may further be coupled to an Input/output (I/O) interface and a computer data storage unit. An I/O interface may include any system for exchanging information to or from an input device 592 or output device 593. The input device 592 may be, inter alia, a keyboard, a mouse, etc. or in some embodiments the filtration system 100. The output device 593 may be, inter alia, a printer, a plotter, a display device (such as a computer screen), a magnetic tape, a removable hard disk, a floppy disk, etc. The memory devices 594 and 595 may be, inter alia, a hard disk, a floppy disk, a magnetic tape, an optical storage such as a compact disc (CD) or a digital video disc (DVD), a dynamic random access memory (DRAM), a read-only memory (ROM), etc. The bus may provide a communication link between each of the components in computer 500, and may include any type of transmission link, including electrical, optical, wireless, etc.

An I/O interface may allow computer system 500 to store information (e.g., data or program instructions such as program code 597) on and retrieve the information from computer data storage unit (not shown). Computer data storage unit includes a known computer-readable storage medium, which is described below. In one embodiment, computer data storage unit may be a non-volatile data storage device, such as a magnetic disk drive (i.e., hard disk drive) or an optical disc drive (e.g., a CD-ROM drive which receives a CD-ROM disk).

As will be appreciated by one skilled in the art, in a first embodiment, the present invention may be a method; in a second embodiment, the present invention may be a system; and in a third embodiment, the present invention may be a computer program product. Any of the components of the embodiments of the present invention can be deployed, managed, serviced, etc. by a service provider that offers to deploy or integrate computing infrastructure with respect to compensating for the shift in die placement using mathematical models to predict the likelihood of future die displacement. Thus, an embodiment of the present invention discloses a process for supporting computer infrastructure, where the process includes providing at least one support service for at least one of integrating, hosting, maintaining and deploying computer-readable code (e.g., program code 597) in a computer system (e.g., computer 500) including one or more processor(s) 591, wherein the processor(s) carry out instructions contained in the computer code 597 causing the computer system to compensating for the shift in die placement using mathematical models to predict the likelihood of future die displacement. Another embodiment discloses a process for supporting computer infrastructure, where the process includes integrating computer-readable program code into a computer system including a processor.

The step of integrating includes storing the program code in a computer-readable storage device of the computer system through use of the processor. The program code, upon being executed by the processor, implements a method of compensating for the shift in die placement using mathematical models to predict the likelihood of future die displacement. Thus the present invention discloses a process for supporting, deploying and/or integrating computer infrastructure, integrating, hosting, maintaining, and deploying computer-readable code into the computer system 500, wherein the code in combination with the computer system 500 is capable of performing a method for compensating for the shift in die placement using mathematical models to predict the likelihood of future die displacement.

A computer program product of the present invention comprises one or more computer readable hardware storage devices having computer readable program code stored therein, said program code containing instructions executable by one or more processors of a computer system to implement the methods of the present invention.

A computer program product of the present invention comprises one or more computer readable hardware storage devices having computer readable program code stored therein, said program code containing instructions executable by one or more processors of a computer system to implement the methods of the present invention.

A computer system of the present invention comprises one or more processors, one or more memories, and one or more computer readable hardware storage devices, said one or more hardware storage devices containing program code executable by the one or more processors via the one or more memories to implement the methods of the present invention.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

In some embodiments, rather than being stored and accessed from a hard drive, optical disc or other writeable, rewriteable, or removable hardware memory device 95, stored computer program code 584 (e.g., including algorithms) may be stored on a static, nonremovable, read-only storage medium such as a Read-Only Memory (ROM) device 585, or may be accessed by processor 91 directly from such a static, nonremovable, read-only medium 585. Similarly, in some embodiments, stored computer program code 597 may be stored as computer-readable firmware 585, or may be accessed by processor 591 directly from such firmware 585, rather than from a more dynamic or removable hardware data-storage device 595, such as a hard drive or optical disc.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper (or any other alternative metals) transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms. The terms "first" and "second" are used to distinguish elements and are not used to denote a particular order.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An automated semiconductor device placement improvement method comprising:
    automatically executing, by a processor of a pick and place apparatus, a previous plurality of shift measurements for offsets from an original placement of a previous plurality of semiconductor die of a previous plurality of semiconductor wafers for processing;
    retrieving, by said processor, a previous plurality of shift measurement values associated with said previous plurality of shift measurements;
    storing, by said processor in a database, said previous plurality of shift measurement values;
    automatically executing, after the storing the said previous plurality of shift measurement values, by said processor of said pick and place apparatus, a shift measurement associated with an offset from an original placement of a plurality of semiconductor die of a semiconductor wafer for processing;
    retrieving, by said processor, a shift measurement value associated with said shift measurement;
    storing, by said processor in a database, said shift measurement value;
    executing, by said processor, specified models with respect to said shift measurement value and said retrieved previous plurality of shift measurement values;
    determining, by said processor based on results of said executing, a predicted shift measurement value associated with a future offset for a new plurality of semiconductor die on a new semiconductor wafer for processing; and
    automatically placing, by said processor, placement hardware of said pick and place apparatus in multiple positions for generating said new plurality of semiconductor die on said new semiconductor wafer is accordance with said predicted shift measurement value.

2. The method of claim 1, wherein said specified models comprise mathematical models.

3. The method of claim 2, wherein said mathematical models comprise one dimensional models selected from the group consisting of polynomial models, transcendental models, piecewise models, and manual input models.

4. The method of claim 2, wherein said mathematical models comprise multiple dimensional models selected from the group consisting of multivariable polynomial models, thin plate spline models, and manual input models.

5. The method of claim 1, further comprising:
    generating, by said processor executing said placement hardware in response to said automatically placing, said new plurality of semiconductor die within said new semiconductor wafer is accordance with said predicted shift measurement value.

6. The method of claim 1, further comprising:
    automatically shifting, by said processor, said new semiconductor wafer in a plurality of new positions in accordance with said predicted shift measurement value.

7. The method of claim 1, further comprising:
    presenting, by said processor via a specialized graphical user interface (GUI), a virtual image of said new plurality of semiconductor die on said new semiconductor wafer is accordance with said predicted shift measurement value.

8. A computer program product, comprising a computer readable hardware storage device storing a computer readable program code, said computer readable program code comprising an algorithm that when executed by a processor of a pick and place apparatus implements an automated semiconductor device placement improvement method, said method comprising:
    automatically executing, by said processor of said pick and place apparatus, a previous plurality of shift measurements for offsets from an original placement of a previous plurality of semiconductor die of a previous plurality of semiconductor wafers for processing;
    retrieving, by said processor, a previous plurality of shift measurement values associated with said previous plurality of shift measurements;
    storing, by said processor in a database, said previous plurality of shift measurement values;
    automatically executing, after the storing the said previous plurality of shift measurement values, by said processor, a shift measurement associated with an offset from an original placement of a plurality of semiconductor die of a semiconductor wafer for processing;
    retrieving, by said processor, a shift measurement value associated with said shift measurement;
    storing, by said processor in a database, said shift measurement value;
    executing, by said processor, specified models with respect to said shift measurement value and said retrieved previous plurality of shift measurement values;
    determining, by said processor based on results of said executing, a predicted shift measurement value associated with a future offset for a new plurality of semiconductor die on a new semiconductor wafer for processing; and
    automatically placing, by said processor, placement hardware of said pick and place apparatus in multiple positions for generating said new plurality of semiconductor die on said new semiconductor wafer is accordance with said predicted shift measurement value.

9. The computer program product of claim 8, wherein said specified models comprise mathematical models.

10. The computer program product of claim 9, wherein said mathematical models comprise one dimensional models selected from the group consisting of polynomial models, transcendental models, piecewise models, and manual input models.

11. The computer program product of claim 9, wherein said mathematical models comprise multiple dimensional models selected from the group consisting of multivariable polynomial models, TPS models, and manual input models.

12. The computer program product of claim 8, wherein said method further comprises:
generating, by said processor executing said placement hardware in response to said automatically placing, said new plurality of semiconductor die within said new semiconductor wafer is accordance with said predicted shift measurement value.

13. The computer program product of claim 8, wherein said method further comprises:
automatically shifting, by said processor, said new semiconductor wafer in a plurality of new positions in accordance with said predicted shift measurement value.

14. The computer program product of claim 8, wherein said method further comprises:
presenting, by said processor via a specialized graphical user interface (GUI), a virtual image of said new plurality of semiconductor die on said new semiconductor wafer is accordance with said predicted shift measurement value.

15. A pick and place apparatus comprising a processor coupled to a computer-readable memory unit, said memory unit comprising instructions that when executed by the computer processor implements an automated semiconductor device placement improvement method comprising:
automatically executing, by said processor, a previous plurality of shift measurements for offsets from an original placement of a previous plurality of semiconductor die of a previous plurality of semiconductor wafers for processing;
retrieving, by said processor, a previous plurality of shift measurement values associated with said previous plurality of shift measurements;
storing, by said processor in a database, said previous plurality of shift measurement values;
automatically executing, after the storing the said previous plurality of shift measurement values, by said processor, a shift measurement associated with an offset from an original placement of a plurality of semiconductor die of a semiconductor wafer for processing;
retrieving, by said processor, a shift measurement value associated with said shift measurement;
storing, by said processor in a database, said shift measurement value;
executing, by said processor, specified models with respect to said shift measurement value and said retrieved previous plurality of shift measurement values;
determining, by said processor based on results of said executing, a predicted shift measurement value associated with a future offset for a new plurality of semiconductor die on a new semiconductor wafer for processing; and
automatically placing, by said processor, placement hardware of said pick and place apparatus in multiple positions for generating said new plurality of semiconductor die on said new semiconductor wafer is accordance with said predicted shift measurement value.

16. The pick and place apparatus of claim 15, wherein said specified models comprise mathematical models.

17. The pick and place apparatus of claim 16, wherein said mathematical models comprise one dimensional models selected from the group consisting of polynomial models, transcendental models, piecewise models, and manual input models.

18. The pick and place apparatus of claim 16, wherein said mathematical models comprise multiple dimensional models selected from the group consisting of multivariable polynomial models, thin plate spline models, and manual input models.

19. The pick and place apparatus of claim 15, wherein said method further comprises:
generating, by said processor executing said placement hardware in response to said automatically placing, said new plurality of semiconductor die within said new semiconductor wafer is accordance with said predicted shift measurement value.

20. The pick and place apparatus of claim 15, wherein said method further comprises:
automatically shifting, by said processor, said new semiconductor wafer in a plurality of new positions in accordance with said predicted shift measurement value.

\* \* \* \* \*